United States Patent
Mattausch et al.

(10) Patent No.: US 8,331,120 B2
(45) Date of Patent: Dec. 11, 2012

(54) OFFSET REMOVAL CIRCUIT, ASSOCIATIVE MEMORY INCLUDING THE SAME, AND OFFSET VOLTAGE REMOVAL METHOD

(75) Inventors: Hans Juergen Mattausch, Hiroshima (JP); Tetsushi Koide, Hiroshima (JP); Yuki Tanaka, Hiroshima (JP)

(73) Assignee: Hiroshima University, Hiroshima (JP)

( * ) Notice: Subject to any disclaimer, the term of this patent is extended or adjusted under 35 U.S.C. 154(b) by 292 days.

(21) Appl. No.: 12/665,316

(22) PCT Filed: Jul. 31, 2008

(86) PCT No.: PCT/JP2008/002070
§ 371 (c)(1),
(2), (4) Date: Apr. 8, 2010

(87) PCT Pub. No.: WO2010/013295
PCT Pub. Date: Feb. 4, 2010

(65) Prior Publication Data
US 2010/0202178 A1     Aug. 12, 2010

(51) Int. Cl.
*G11C 15/00*     (2006.01)
(52) U.S. Cl. .................................. 365/49.17; 365/207
(58) Field of Classification Search ............ 365/49.17, 365/207
See application file for complete search history.

(56) References Cited

U.S. PATENT DOCUMENTS

| | | | |
|---|---|---|---|
| 7,420,410 B2 * | 9/2008 | Ohba | 330/9 |
| 7,746,678 B2 * | 6/2010 | Mattausch et al. | 365/49.1 |

FOREIGN PATENT DOCUMENTS

| | | |
|---|---|---|
| JP | 08-292745 | 11/1996 |
| JP | 2001-185963 | 7/2001 |
| JP | 2002-288985 | 10/2002 |
| JP | 2005-109939 | 4/2005 |
| JP | 2005-209317 | 8/2005 |
| JP | 2006-352401 | 12/2006 |

OTHER PUBLICATIONS

Japanese Office Action for JP 2009-525836 mailed Feb. 16, 2010 (with English translation).
Notice of Reasons for Rejection for JP 2009-525836 mailed Jul. 6, 2010 (with English translation).
Tveter, D.R., "The Pattern Recognition Basis of Artificial Intelligence," Los Alamitos, CA: IEEE Computer Society, 1998, pp. 86-92.
Mattausch, H.J., et al., "Compact Associative-Memory Architecture with Fully Parallel Search Capability for the Minimum Hamming Distance," IEEE Journal of Solid-State Circuits, vol. 37, No. 2, Feb. 2002, pp. 218-227.

(Continued)

*Primary Examiner* — Huan Hoang
(74) *Attorney, Agent, or Firm* — Foley & Lardner LLP

(57) ABSTRACT

An offset removal circuit (10) includes a removal circuit (1) and a removal circuit (2). The removal circuit (1) digitally removes offset voltage from an input voltage Vin. The removal circuit (2) removes offset voltage, in an analog manner, from the voltage subjected to offset voltage removal by the removal circuit (1). Then, the removal circuit (2) outputs the voltage subjected to the offset voltage removal to a non-inverting input terminal of a differential amplifier (20).

24 Claims, 11 Drawing Sheets

OTHER PUBLICATIONS

Mattausch, H.J., et al., "Fully-Parallel Pattern-Matching Engine with Dynamic Adaptability to Hamming or Manhattan Distance," 2002 Symposium on VLSI Circuits Digest of Technical papers, pp. 252-255.

Office Action for the corresponding Japanese Application, 2009-525836 with English Translation, dispatched Oct. 6, 2009.

International Search Report for PCT/JP2008/002070, dated Oct. 6, 2008 (English Translation not readily available).

Abedin, M.A. et al., "Application of Fully Parallel Associative Memory in Two-Stage Pattern Matching," Jan. 2007, 5th Hiroshima International Workshop on Nanoelectronics for Terra-Bit Information Processings, 2 pages.

Abedin, M.A. et al., "Fully-Parallel Associative Memory Architecture Realizing Minimum Euclidean Distance Search," Sep. 16, 2005, 4th Hiroshima International Workshop on Nanoelectronics for Terra-Bit Information Processing, 3 pages.

Abedin, M.A. et al., "Fully Parallel Associative Memory Architecture with Mixed Digital-Analog Match Circuit for Nearest Euclidean Distance Search," Dec. 2006, *IEEE*, Asia Pacific Conference on Circuits and Systems (APCCAS2006), pp. 1309-1312.

* cited by examiner

OFFSET REMOVAL CIRCUIT, ASSOCIATIVE MEMORY INCLUDING THE SAME, AND OFFSET VOLTAGE REMOVAL METHOD

TECHNICAL FIELD

The present invention relates to an offset removal circuit which removes offset voltage, an associative memory including the offset removal circuit, and an offset voltage removal method.

BACKGROUND ART

Recently, in information-processing technology, especially in the fields of image compression and image recognition, associative memories provided with minimum distance search capabilities have been attracting attention. The associative memories are very useful for pattern matching for object recognition needed in intelligent information processing, and the data compression using a data group called a code book.

The associative memory is a typical functional memory which has a function to search multiple items of reference data in the associative memory for a data item which best matches (is nearest to) an inputted data string (search data). Because of its excellent search capabilities, the associative memory is expected to dramatically improve performance of applications which have pattern matching capabilities for image compression and image recognition described above.

It is a basic process of pattern matching to find a data item closest to input data from R items of reference data each of which has a bit width of W (D. R. Tveter, "The Pattern Recognition Basis Of Artificial Intelligence," Los Alamitos, Calif.: IEEE computer society, 1998). Thus, the minimum distance search associative memory plays a central role in information processing such as image compression and image recognition (Japanese Patent Laid-Open No. 2002-288985).

Existing fully-parallel minimum distance search associative memories which have been proposed include those which have search capabilities for one of the Hamming, Manhattan, and Euclidean distances which are simple distances. The distances are defined by Expression 1 and Expression 2 (H. J. Mattausch, T. Gyohten, Y. Soda, and T. Koide, "Compact Associative-Memory Architecture with Fully-Parallel Search Capability for the Minimum Hamming Distance", IEEE Journal of Solid-State Circuits, Vol. 37, pp. 218-227, 2002).

[Expression 1]

$$D = \sum_{i=1}^{w} |S_i - R_i| \quad \text{Hamming or Manhattan distance}$$

[Expression 2]

$$D = \sqrt{\sum_{i=1}^{w} (S_i - R_i)^2} \quad \text{Euclidean distance}$$

where $S=\{S_1, S_2, \ldots, S_W\}$ represents input data and $R=\{R_1, R_2, \ldots, R_W\}$ represents reference data. In Expression 1, when $S_i$ and $R_i$ are 1-bit binary numbers, D is the Hamming distance, and when $S_i$ and $R_i$ are n-bit binary numbers (n>1), D is the Manhattan distance. In Expression 2, D represents the Euclidean distance.

So far, there have been proposed a fully-parallel minimum Hamming distance search architecture (H. J. Mattausch, T. Gyohten, Y. Soda, and T. Koide, "Compact Associative-Memory Architecture with Fully-Parallel Search Capability for the Minimum Hamming Distance", IEEE Journal of Solid-State Circuits, Vol. 37, pp. 218-227, 2002) and a fully-parallel minimum Manhattan distance search architecture (H. J. Mattausch, N. Omori, S. Fukae, T. Koide and T. Gyohten, "Fully-Parallel Pattern-Matching Engine with Dynamic Adaptability to Hamming or Manhattan Distance," 2002 Symposium on VLSI Circuits Digest of Technical Papers, pp. 252-255, 2002; and Japanese Patent Laid-Open No. 2005-209317).

The associative memory includes a unit data storage circuit (US), unit data comparator circuit (UC), word comparator circuit (WC), winner line-up amplifier (WLA) circuit, and winner take all (WTA) circuit.

The unit data storage circuit stores reference data. The unit data comparator circuit (UC) compares the reference data with search data. The word comparator circuit converts a comparison signal into a current value. The winner line-up amplifier circuit (WLA circuit) converts a comparison current signal into a voltage and amplifies the resulting voltage. The winner take all circuit further amplifies an output from the WLA circuit. The associative memory also includes a search data storage circuit, row decoder, column decoder, and read/write circuit as peripheral circuits.

The unit data comparator circuit UC compares the reference data with the search data and the word comparator circuit WC outputs a comparison current signal C which represents results of comparison between the reference data and search data to the WLA circuit. The WLA circuit 100 converts the comparison current signal C into a comparison voltage signal LA and amplifies the resulting comparison voltage signal LA. The WTA circuit 200 further amplifies the comparison voltage signal LA. Eventually, the WTA circuit sets a threshold, and thereby outputs the best matching data (winner) as 1, and the other data (loser) as 0.

DISCLOSURE OF THE INVENTION

However, if characteristics of multiple differential amplifiers used for the WTA circuit vary, offset voltage occurs. As a result, there is a problem that the reference data closest to input data is outputted as the second closest data to the input data.

Thus, it is desirable to provide an offset removal circuit which can remove offset voltage with high accuracy.

It is also desirable to provide an associative memory including the offset removal circuit which can remove offset voltage with high accuracy.

Furthermore, it is desirable to provide an offset voltage removal method which can remove offset voltage with high accuracy.

An offset removal circuit removing offset voltage caused by variations in characteristics of a plurality of differential amplifiers comprises a first removal circuit and a second removal circuit. The first removal circuit is connected to a non-inverting input terminal of the differential amplifier, and removes offset voltage from an input voltage inputted to the differential amplifier with a first accuracy. The second removal circuit is connected to an inverting input terminal of the differential amplifier, and removes offset voltage, with a second accuracy higher than the first accuracy, from the voltage subjected to offset voltage removal by the first removal circuit.

The first removal circuit may digitally remove the offset voltage from the input voltage. The second removal circuit may remove the offset voltage in an analog manner from the voltage subjected to offset voltage removal.

The first removal circuit may digitally remove the offset voltage from the input voltage when the second removal circuit is stopped. The second removal circuit may remove the offset voltage from the voltage subjected to offset voltage removal, in an analog manner when the first removal circuit is stopped.

The first removal circuit may include a plurality of MOS transistors and a control circuit. The plurality of MOS transistors may be connected in parallel between the non-inverting input terminal and a ground node and may have different resistances from each other. The control circuit may decrease the input voltage stepwise until an output voltage of the differential amplifier is inverted, by turning on and off the plurality of MOS transistors using a digital signal. The second removal circuit may include capacitance being connected between the inverting input terminal and a control node receiving the control voltage and receiving a voltage obtained by subtracting the control voltage from the output voltage of the differential amplifier.

The control circuit may output the digital signal to the plurality of MOS transistors such that a digital value increases from a minimum value.

Also, the associative memory comprises a memory array unit, WLA (Winner Line-up Amplifier) circuit, and WTA (Winner-Take-All) circuit. The memory array unit compares in parallel each of a plurality of pre-stored reference data items with inputted search data and generates a plurality of comparison current signals having respective current values corresponding to respective comparison results. The WLA circuit converts the plurality of comparison current signals into voltages and amplifies the resulting voltages. The WTA circuit further amplifies output from the WLA circuit. The WLA circuit includes a plurality of current/voltage conversion circuits, a plurality of differential amplification circuits, a plurality of differential amplification circuits, and a control circuit. The plurality of current/voltage conversion circuits are provided corresponding to the plurality of comparison current signals and convert the corresponding comparison current signals into comparison voltage signals. The plurality of differential amplification circuits are provided corresponding to the plurality of current/voltage conversion circuits and receive the comparison voltage signals from the corresponding current/voltage conversion circuits at one input. The control circuit generates a control voltage from outputs of the plurality of differential amplification circuits and provides the generated control voltage commonly to another input of the plurality of differential amplification circuits, the control voltage following a minimum or maximum voltage of the plurality of comparison voltage signals. Each of the plurality of differential amplifier circuits has a differential amplifier, a first removal circuit, and a second removal circuit. The differential amplifier amplifies the comparison voltage signal from the corresponding current/voltage conversion circuit and outputs the amplified comparison voltage signal. The first removal circuit is connected to a non-inverting input terminal of each of the differential amplifiers and removes offset voltage caused by variations in characteristics of the plurality of differential amplification circuits from the comparison voltage signal with a first accuracy. The second removal circuit is connected to an inverting input terminal of the differential amplifier, and removes offset voltage, with a second accuracy higher than the first accuracy, based on the comparison voltage signal subjected to offset voltage removal by the first removal circuit.

An offset voltage removal method comprises a first step of removing offset voltage caused by variations in characteristics of a plurality of differential amplifiers from an input voltage with a first accuracy and a second step of removing offset voltage, with a second accuracy higher than the first accuracy, from the voltage subjected to offset voltage removal in the first step.

In the first step, the offset voltage may be digitally removed and in the second step, the offset voltage may be removed in an analog manner.

The first step may be carried out when the second step is stopped and the second step may be carried out when the first step is stopped.

The first step may comprise a first sub step of flowing a current on an input line to a ground node by a MOS transistor turned on according to a digital value and thereby decreasing a voltage on the input line stepwise, the input line being connected to a non-inverting input terminal of the differential amplifier, a second sub step of determining whether or not an output voltage of the differential amplifier has been inverted, a third sub step of flowing a current on the input line to a ground node by a MOS transistor turned on according to an increased digital value and thereby decreasing a voltage on the input line stepwise when it is determined that the output voltage of the differential amplifier has not been inverted, and a fourth sub step of executing repeatedly the third sub step until the output voltage of the differential amplifier is inverted.

An offset voltage is removed from an input voltage to the differential amplifier with a first accuracy, and then any remaining offset voltage is removed, with a second accuracy higher than the first accuracy, from the voltage subjected to offset voltage removal. Consequently, any offset voltage left unremoved in the offset voltage removal with the first accuracy is removed more finely.

Thus, offset voltage can be removed with high accuracy.

BEST MODE FOR CARRYING OUT THE INVENTION

Figure 1:
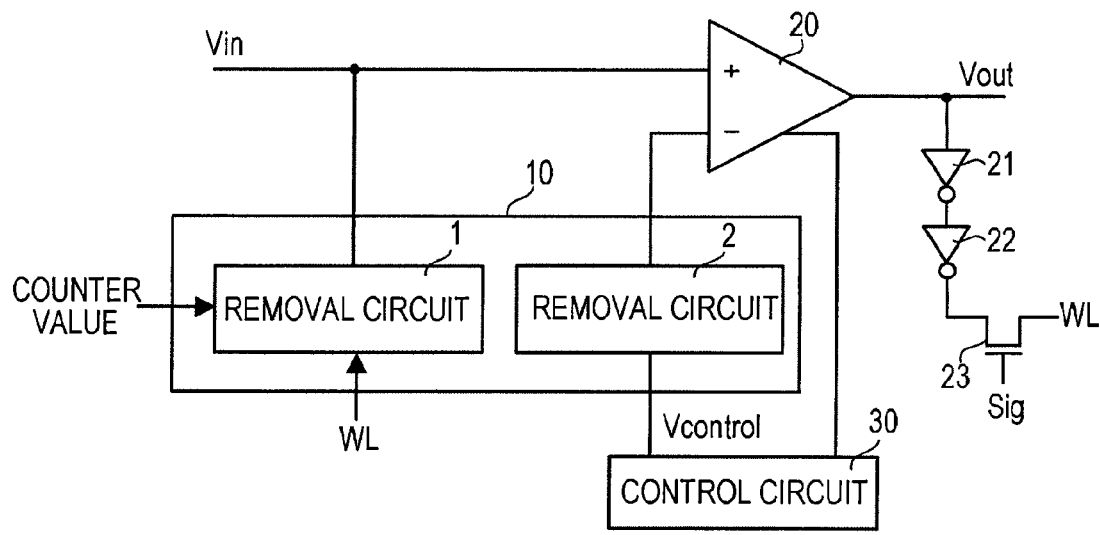
FIG. 1 is a block diagram of an offset removal circuit according to an embodiment of the present invention.

An embodiment of the present invention will be described in detail with reference to the drawings. In figures the same or equivalent components are denoted by the same reference numerals, and redundant description thereof will be omitted.

FIG. 1 is a block diagram of an offset removal circuit according to the embodiment of the present invention. Referring to FIG. 1, the offset removal circuit 10 according to the embodiment of the present invention includes removal circuits 1 and 2.

The removal circuit 1 is connected to a non-inverting input terminal of a differential amplifier 20. The removal circuit 1 receives a signal WL which is an output voltage Vout of the differential amplifier 20 inverted by two inverters 21 and 22 connected in series. Also, the removal circuit 1 externally receives a counter value in 4-bit digital form.

When the removal circuit 1 is in operation, the signal WL is composed of "1" and when the removal circuit 1 is not in operation, the signal WL is composed of "0." A signal Sig is composed of "1" or "0." The signal Sig is composed of "1" when the removal circuit 1 is in operation, and is composed of "0" when the removal circuit 1 is not in operation. Therefore, an n-type MOS (Metal Oxide Semiconductor) transistor 23 is turned on and off by the signal Sig.

Upon receiving the signal WL composed of "1," the removal circuit 1 digitally removes offset voltage from an input voltage Vin inputted to the non-inverting input terminal of the differential amplifier 20 by a method described later based on the count value received externally and outputs the resulting voltage to the non-inverting input terminal of the differential amplifier 20.

The offset voltage is caused by variations in characteristics of multiple differential amplifiers 20 when multiple voltages are amplified using the multiple differential amplifiers 20 arranged in parallel.

The removal circuit 2 receives a control voltage Vcontrol from a control circuit 30. The control voltage Vcontrol is generated according to a voltage level of the output voltage Vout from the differential amplifier 20 and inputted to the inverting input terminal of the differential amplifiers 20. The control voltage Vcontrol equals a supply voltage Vdd when the voltage level of the output voltage Vout is equal to the supply voltage Vdd, and falls by following the output voltage Vout when the output voltage Vout falls below the supply voltage Vdd.

Upon receiving the control voltage Vcontrol from the control circuit 30, the removal circuit 2 removes offset voltage, in an analog manner by a method described later, from the voltage subjected to offset voltage removal by the removal circuit 1 and outputs the resulting voltage to the inverting input terminal of the differential amplifier 20.

In this way, the offset removal circuit 10 digitally removes offset voltage from the input voltage Vin using the removal circuit 1, and further removes offset voltage, in an analog manner using the removal circuit 2, from the voltage subjected to offset voltage removal.

Figure 2:
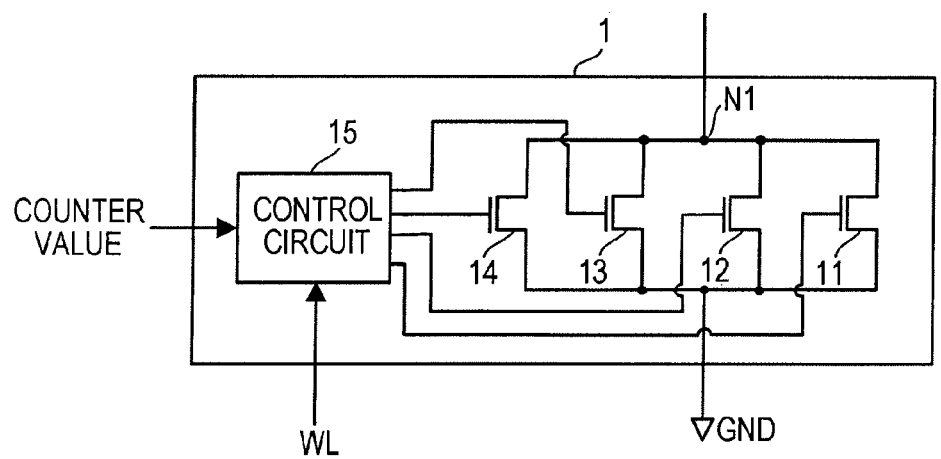
FIG. 2 is a block diagram of one of the removal circuits shown in FIG. 1.

FIG. 2 is a block diagram of the removal circuit 1 shown in FIG. 1. Referring to FIG. 2, the removal circuit 1 includes n-type MOS transistors 11 to 14 and a control circuit 15.

The n-type MOS transistors 11 to 14 are connected in parallel between the non-inverting input terminal of the differential amplifier 20 and a ground node. In this case, sources of the n-type MOS transistors 11 to 14 are connected to the ground node, drains of the n-type MOS transistors 11 to 14 are connected to the non-inverting input terminal of the differential amplifier 20, and gates of the n-type MOS transistors 11 to 14 are connected to the control circuit 15.

The n-type MOS transistors 11 to 14 have the same channel width W. The n-type MOS transistors 11 to 14 have channel lengths 4L, 2L, L, and L, respectively. Consequently the n-type MOS transistors 11 to 14 have resistances 4R, 2R, R, and R, respectively.

The control circuit 15 receives the signal WL and externally receives the counter value. Upon receiving the signal WL composed of "1," the control circuit 15 outputs the first bit value B1 of the 4-bit digital value (=counter value) to the gate of the n-type MOS transistor 11, the second bit value B2 to the gate of the n-type MOS transistor 12, the third bit value B3 to the gate of the n-type MOS transistor 13, and the fourth bit value B4 to the gate of the n-type MOS transistor 14.

Upon receiving the signal WL composed of "0," the control circuit 15 stops outputting the first to fourth bit values B1, B2, B3, and B4 to the gates of the n-type MOS transistors 11 to 14.

Figure 3:
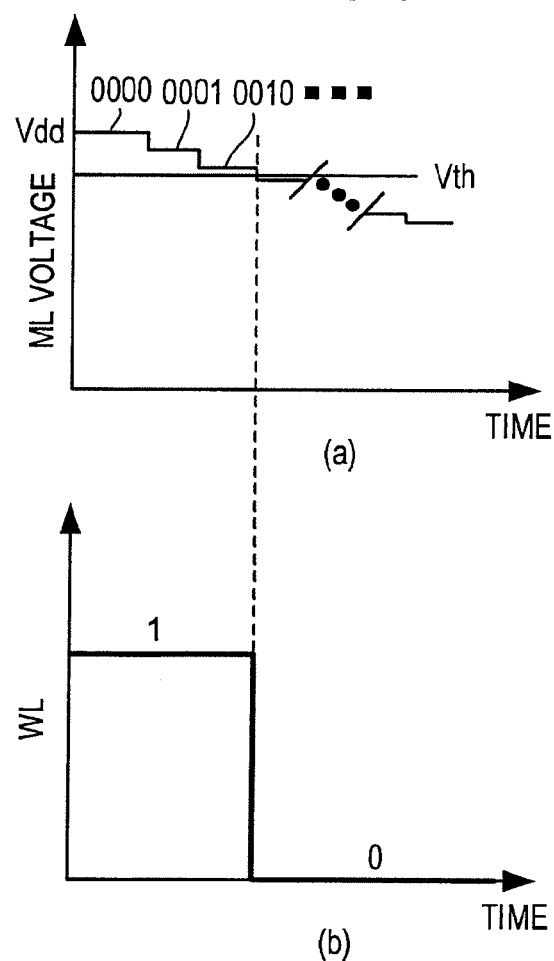
FIG. 3 is diagram for illustrating operation of the removal circuit shown in FIG. 2.
Figure 4:
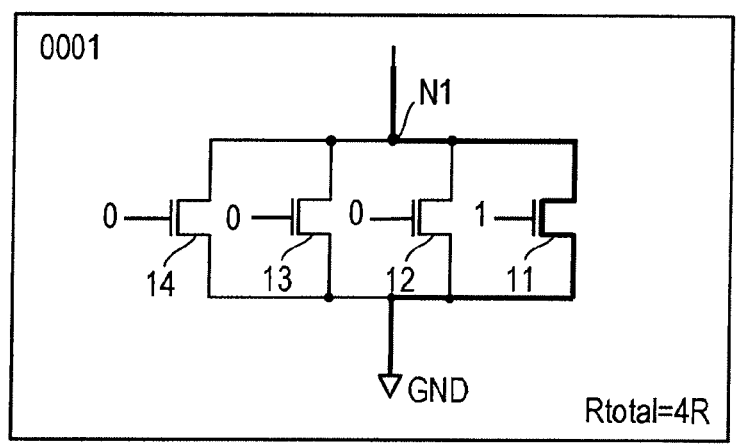
FIG. 4 is a diagram showing an example of the operation of the removal circuit shown in FIG. 2.
Figure 5:
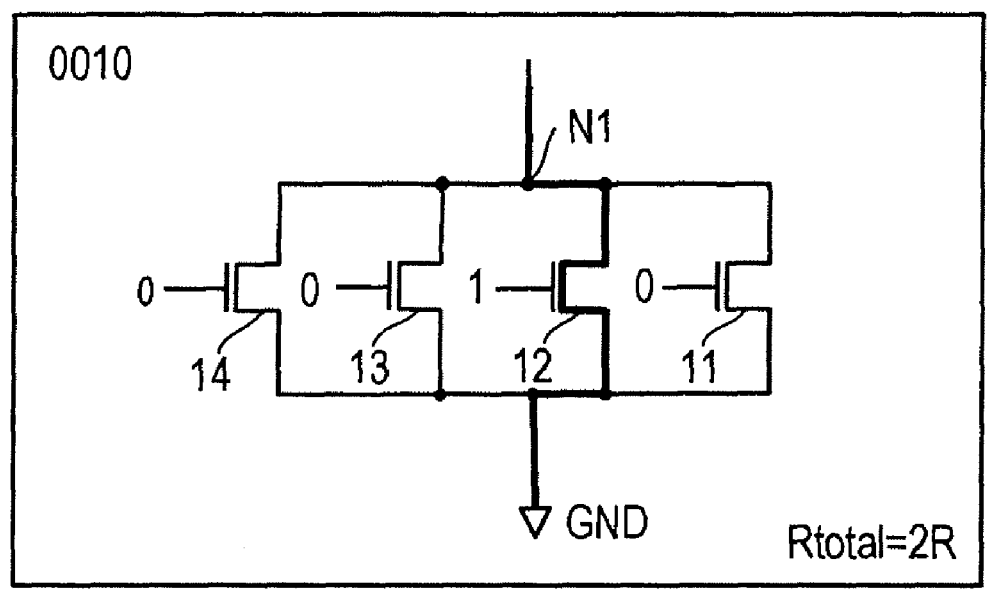
FIG. 5 is a diagram showing an example of the operation of the removal circuit shown in FIG. 2.

FIG. 3 is diagram for illustrating operation of the removal circuit 1 shown in FIG. 2. FIGS. 4 and 5 are diagrams showing examples of the operation of the removal circuit 1 shown in FIG. 2.

In FIG. 3(a), the ordinate represents an ML voltage which is a voltage of a node N1 shown in FIG. 2 and the abscissa represents time. In FIG. 3(b), the ordinate represents the signal WL and the abscissa represents time. The ML voltage is a voltage on a match line which indicates that input data matches reference data in an associative memory.

Referring to FIG. 3(a), when the signal WL composed of "1," the ML voltage falls as the counter value changes from [0000] to [0001], then to [0010], and so on.

Referring to FIG. 3(b), while the ML voltage is falling to a threshold Vth, the signal WL composed of "1," and when the ML voltage approximately coincides with the threshold Vth, the signal WL is set to "0." The threshold Vth is composed of a voltage in when the input voltage Vin is slightly lower than the control voltage Vcontrol.

The control circuit 15 stores counter values of [0000], [0001], [0010], and so on. When the differential amplifier 20 starts operation, the input voltage Vin is set slightly higher than the control voltage Vcontrol (Vin>Vcontrol). The control circuit 15 does not output the counter value to the n-type MOS transistors 11 to 14 until receiving the signal WL composed of "1", and therefore initially the ML voltage is equal to the supply voltage Vdd.

When Vin>Vcontrol is satisfied, the output voltage Vout of the differential amplifier 20 is at a high level and the signal WL is composed of "1." Thus, the control circuit 15 receives the signal WL composed of "1" and sequentially outputs counter values of [0000], [0001], [0010], and so on to the n-type MOS transistors 11 to 14. In this case, the control circuit 15 sequentially outputs the counter values in ascending order to the n-type MOS transistors 11 to 14.

Upon receiving the counter value of [0000], the n-type MOS transistors 11 to 14 are all turned off, and consequently the ML voltage equals the supply voltage Vdd. Upon receiving the counter value of [0001], the n-type MOS transistor 11 is turned on and the n-type MOS transistors 12 to 14 are turned off, and consequently current flows from a node connected to the non-inverting input terminal of the differential amplifier 20 to the ground node via the n-type MOS transistor 11 (see FIG. 4). As a result, the ML voltage falls below the supply voltage Vdd.

After that, upon receiving the counter value of [0010], the n-type MOS transistor 12 is turned on and the n-type MOS transistors 11, 13 and 14 are turned off, and consequently current flows from the node connected to the non-inverting input terminal of the differential amplifier 20 to the ground node via the n-type MOS transistor 12 (see FIG. 5). Since resistance (=2R) of the n-type MOS transistor 12 is smaller than resistance (=4R) of the n-type MOS transistor 11, a larger current flows to the ground node and the ML voltage falls further.

Similarly, the n-type MOS transistors 11 to 14 cause current to flow to the ground node subsequently according to the counter value. This operation is continued until the ML voltage approximately equals the threshold Vth, i.e., until the input voltage Vin becomes slightly lower than the control voltage Vcontrol.

Since the input voltage Vin coincides with the ML voltage, the operation described above causes the input voltage Vin to fall digitally.

When the ML voltage approximately equals the threshold Vth, since the input voltage Vin becomes lower than the control voltage Vcontrok, the output voltage Vout of the differential amplifier 20 is inverted, the signal WL is set to "0." As a result, the control circuit 15 stops outputting the counter values to the n-type MOS transistors 11 to 14. Therefore, the removal circuit 1 stops operation.

Figure 6:
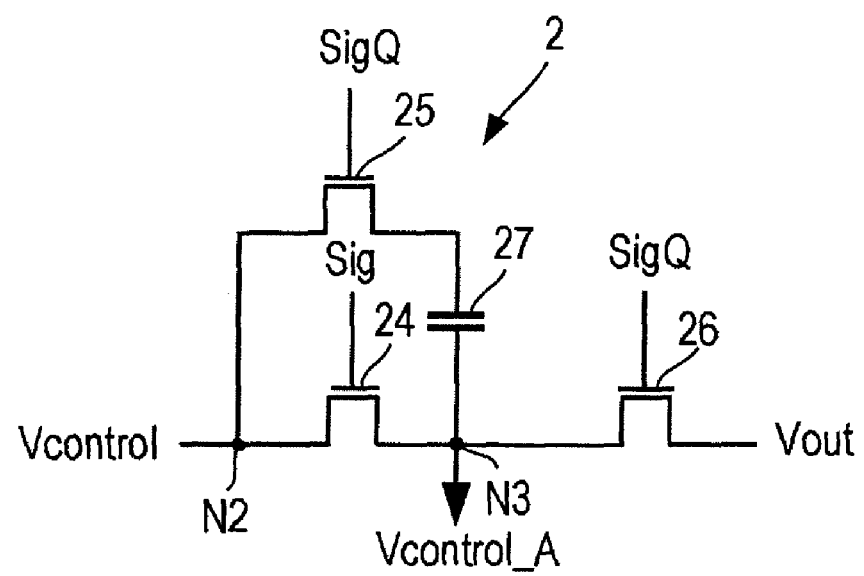
FIG. 6 is a block diagram of the other removal circuit shown in FIG. 1.

FIG. 6 is a block diagram of the other removal circuit 2 shown in FIG. 1. Referring to FIG. 6, the removal circuit 2 includes n-type MOS transistors 24 to 26 and a capacitor 27. The n-type MOS transistor 24 is connected between a node N2 and node N3. In this case, the n-type MOS transistor 24 has its source connected to the node N2, and its drain to the node N3.

The n-type MOS transistor 25 and capacitor 27 are connected between the node N2 and node N3, in series with each other and in parallel with the n-type MOS transistor 24. In this case, the n-type MOS transistor 25 has its source connected to the node N2 and its drain connected to one electrode of the capacitor 27. The other electrode of the capacitor 27 is connected to the node N3.

The n-type MOS transistor 26 has its source connected to the node N3 and its source connected to an output terminal of the differential amplifier 20.

The node N2 is connected to the control circuit 20 and the node N3 is connected to the inverting input terminal of the differential amplifier 20.

Therefore, the node N2 receives the control voltage Vcontrol from the control circuit 20 and the source of the n-type MOS transistor 26 receives the output voltage Vout of the differential amplifier 20.

The n-type MOS transistor 24 receives the signal Sig at the gate. Each of the n-type MOS transistors 25 and 26 receives a signal SigQ at the gate.

The signal SigQ is set at "0" when the signal Sig is composed of "1," and is set at "1" when the signal Sig is composed of "0."

Consequently, when the removal circuit 1 is in operation, since the signal Sig is composed of "1," the signal SigQ is set at "0," and thus the removal circuit 2 does not operate. On the other hand, when the removal circuit 1 is not in operation, since the signal Sig is composed of "0," the signal SigQ is set at "1," and thus the removal circuit 2 operates.

In this way, the removal circuit 2 operates when the operation of the removal circuit 1 is stopped, and stops operation when the removal circuit 1 comes into operation.

Figure 7:
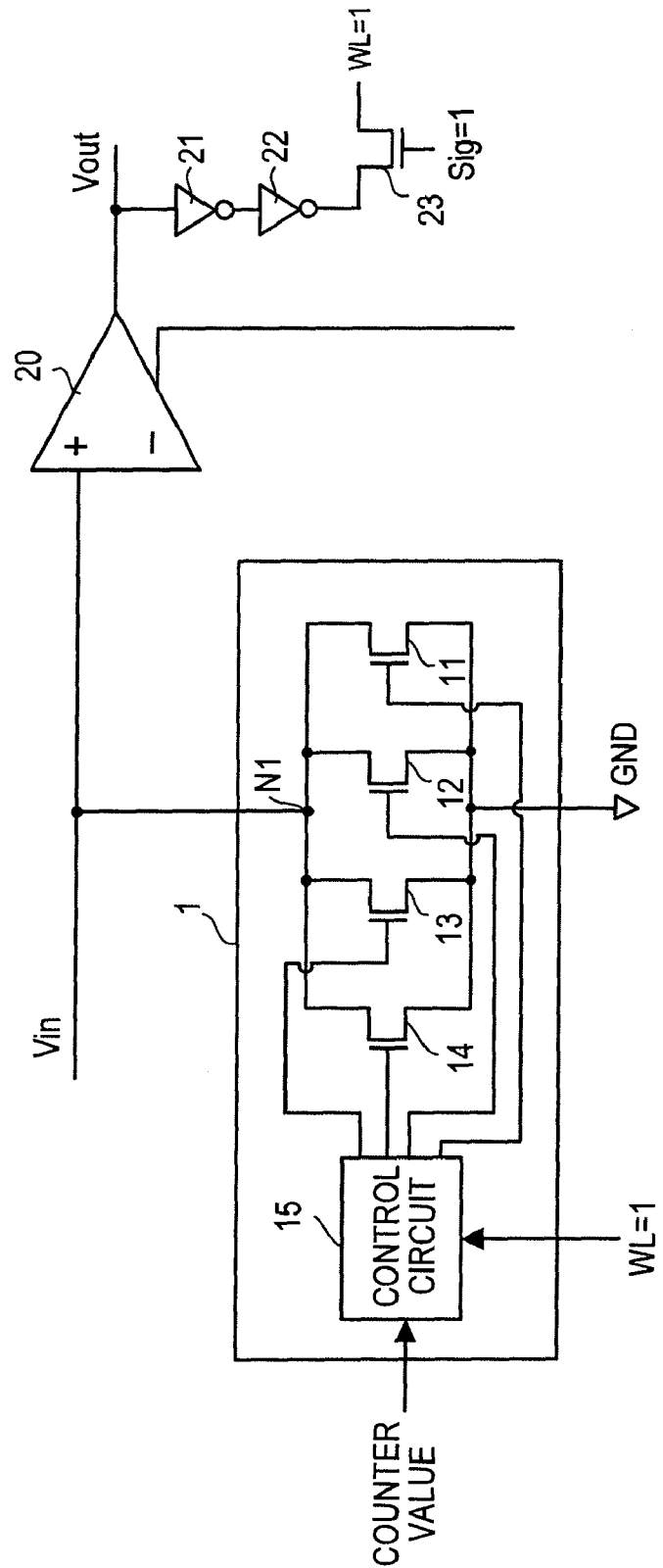
FIG. 7 is a diagram for illustrating an operation of removing offset voltage digitally.

FIG. 7 is a diagram for illustrating an operation of removing offset voltage digitally. Referring to FIG. 7, when the differential amplifier 20 starts operation, since the input voltage Vin is set slightly lower than the control voltage Vcontrol and the n-type MOS transistor 23 receives the signal Sig composed of "1" at the gate, the control circuit 15 receives the signal WL composed of "1."

Then, the control circuit 15 sequentially outputs the counter values of [0000], [0001], [0010], and so on to the n-type MOS transistors 11 to 14, the counter values having been inputted externally and is stored in the control circuit 15.

The n-type MOS transistors 11 to 14 are turned on and off according to the counter values received from the control circuit 15 and cause current to flow from the node N1 to the ground node. Since the control circuit 15 sequentially outputs the counter values in ascending order to the n-type MOS transistors 11 to 14 as described above, the n-type MOS transistors 11 to 14 are turned on and off in the order shown in Table 1.

TABLE 1

| Order | Counter value | N-Type MOS transistors turned on | Resistance |
|---|---|---|---|
| 1 | 0000 | None | Infinite |
| 2 | 0001 | 11 | 4R |
| 3 | 0010 | 12 | 2R |
| 4 | 0011 | 11, 12 | 4R/3 |
| 5 | 0100 | 13 | R |
| 6 | 0101 | 11, 13 | 4R/5 |
| 7 | 0110 | 12, 13 | 2R/3 |
| 8 | 0111 | 11, 12, 13 | 4R/7 |
| 9 | 1000 | 14 | R |
| 10 | 1001 | 11, 14 | 4R/5 |
| 11 | 1010 | 12, 14 | 2R/3 |
| 12 | 1011 | 11, 12, 14 | 4R/7 |
| 13 | 1100 | 13, 14 | R/2 |
| 14 | 1101 | 11, 13, 14 | 4R/9 |
| 15 | 1110 | 12, 13, 14 | 2R/5 |
| 16 | 1111 | 11, 12, 13, 14 | 4R/11 |

The resistance shown in Table 1 is combined resistance of the four n-type MOS transistors 11 to 14 connected in parallel.

Since the combined resistance of the four n-type MOS transistors 11 to 14 connected in parallel decreases gradually except during transition from the eighth counter value [0111] to the ninth counter value [1000], the current flowing from the node N1 to the ground node increases stepwise, causing the ML voltage on the node N1, i.e., the input voltage Vin, to decrease stepwise.

Consequently, offset voltage generated on the input line into the non-inverting input terminal is removed digitally.

In this way, the removal circuit 1 digitally increases the current flowing from the node N1 to the ground node and thereby digitally removes the offset voltage from the input voltage Vin. That is, the removal circuit 1 digitally removes the offset voltage from the input voltage Vin using resistance (resistance of channel layer of the n-type MOS transistors 11 to 14).

When the ML voltage approximately equals the threshold Vth, the control circuit 15 stops outputting the counter values to the n-type MOS transistors 11 to 14 upon receiving the signal WL composed of "0". That is, the removal circuit 1 stops operation. At this stage, the input voltage equals Vin−Vdoc, where Vdoc is the offset voltage removed by the removal circuit 1.

Figure 8:
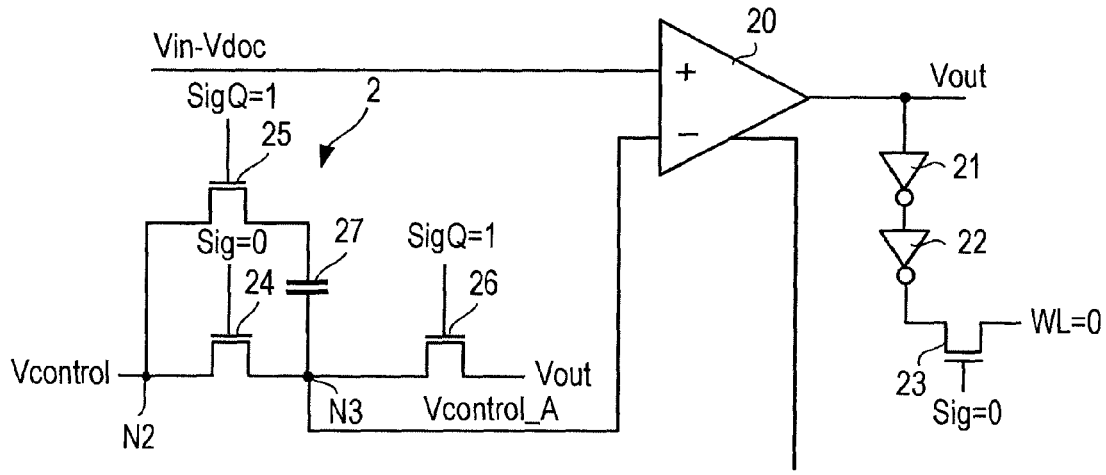
FIG. 8 is a diagram for illustrating an operation of removing offset voltage in an analog manner.

FIG. 8 is a diagram for illustrating an operation of removing offset voltage in an analog manner. Referring to FIG. 8, since offset voltage removal by the removal circuit 2 is carried out after the offset voltage removal by the removal circuit 1 is finished, the voltage Vin−Vdoc is inputted in the non-inverting input terminal of the differential amplifier 20.

When the removal circuit 2 operates, the signal Sig is composed of "0" and the signal SigQ is composed of "1." Consequently, in the removal circuit 2, the n-type MOS transistor 24 is turned off and the n-type MOS transistors 25 and 26 are turned on.

Thus, if an amplification factor of the differential amplifier 20 is A and the offset voltage generated on the input line into the differential amplifier 20 is Vos, the following equation is satisfied.

[Expression 3]

$$A(Vin-Vdoc+Vos-Vout)=Vout \quad (3)$$

Modifying Equation (3) yields the following equation:

[Expression 4]

$$Vout = \frac{A}{A+1}(Vin-Vdoc+Vos) \quad (4)$$
$$= \frac{A}{A+1}Vin + \frac{A}{A+1}(-Vdoc+Vos)$$

Therefore, a voltage Vc applied to the capacitor 27 is given by the following equation:

[Expression 5]

$$Vc = Vout - Vcontrol \quad (5)$$
$$= \frac{-1}{A+1}Vin + \frac{A}{A+1}(-Vdoc+Vos)$$

Thus, the offset voltage given by the second term (A/(A+1)*(−Vdoc+Vos)) on the right side of Equation (5) is removed in an analog manner by the removal circuit 2.

Figure 9:
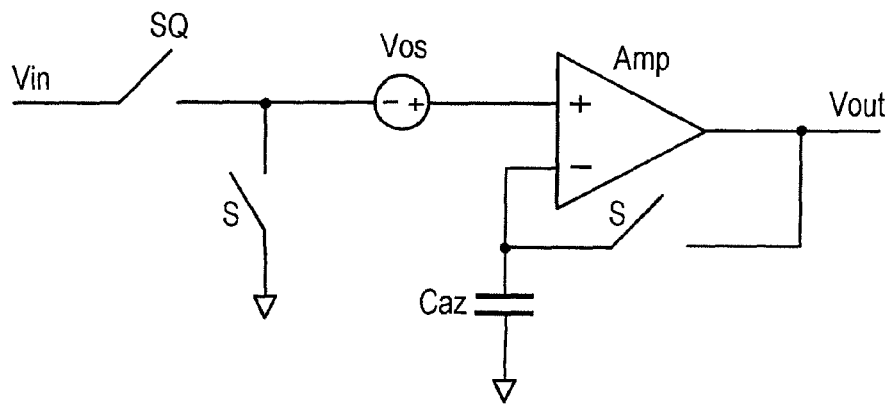
FIG. 9 is a diagram for illustrating a conventional method for removing offset voltage in an analog manner.

FIG. 9 is a diagram for illustrating a conventional method of removing offset voltage in an analog manner. Referring to FIG. 9, conventionally, off-voltage Vos is removed by connecting a capacitor Caz to an inverting input terminal of a differential amplifier Amp. In the circuit shown in FIG. 9, a switch S is closed and a switch SQ is open in non-operating state.

Consequently, the following equation is satisfied.

[Expression 6]

$$A(Vos-Vout)=Vout \quad (6)$$

Modifying Equation (6) yields the following equation:

[Expression 7]

$$Vout = \frac{A}{A+1}Vos \quad (7)$$

Thus, a voltage A*Vout/(A+1) given by Equation (7) is applied to the capacitor Caz.

The following equation is satisfied in operating state.

[Expression 8]

$$A\left(Vin + Vos - \frac{A}{A+1}Vos\right) = Vout \quad (8)$$

Modifying Equation (8) yields the following equation:

[Expression 9]

$$A\left(Vin + \frac{1}{A+1}Vos\right) = Vout \quad (9)$$

Thus, the offset voltage Vos is substantially cancelled off.

When equation (5) and equation (9) are compared, it can be seen that the removal circuit 2 according to the present invention can remove more offset voltage than the conventional offset voltage removal method by −A*Vdov/(A+1).

Figure 10:
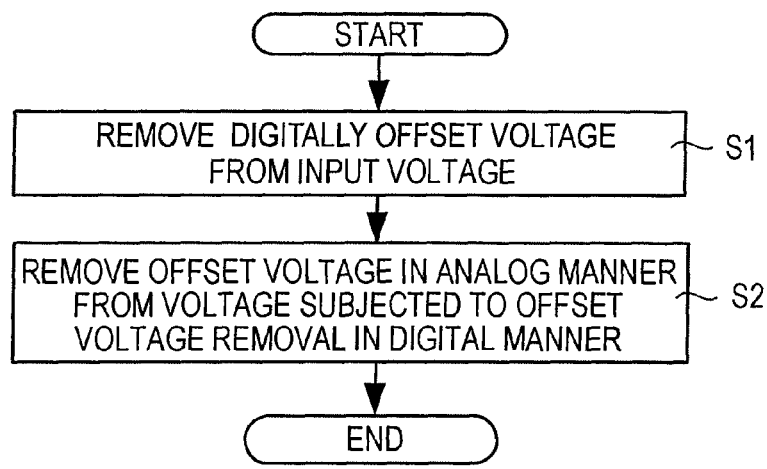
FIG. 10 is a flowchart for illustrating an offset voltage removal method according to the present invention.

FIG. 10 is a flowchart for illustrating an offset voltage removal method according to the present invention.

Referring to FIG. 10, when a series of operations is started, the removal circuit 1 of the offset removal circuit 10 digitally removes offset voltage from the input voltage Vin (Step S1).

Then, the removal circuit 2 further removes offset voltage, in an analog manner, from the voltage subjected to offset voltage removal by the removal circuit 1 (Step S2).

This completes the series of operations.

Figure 11:
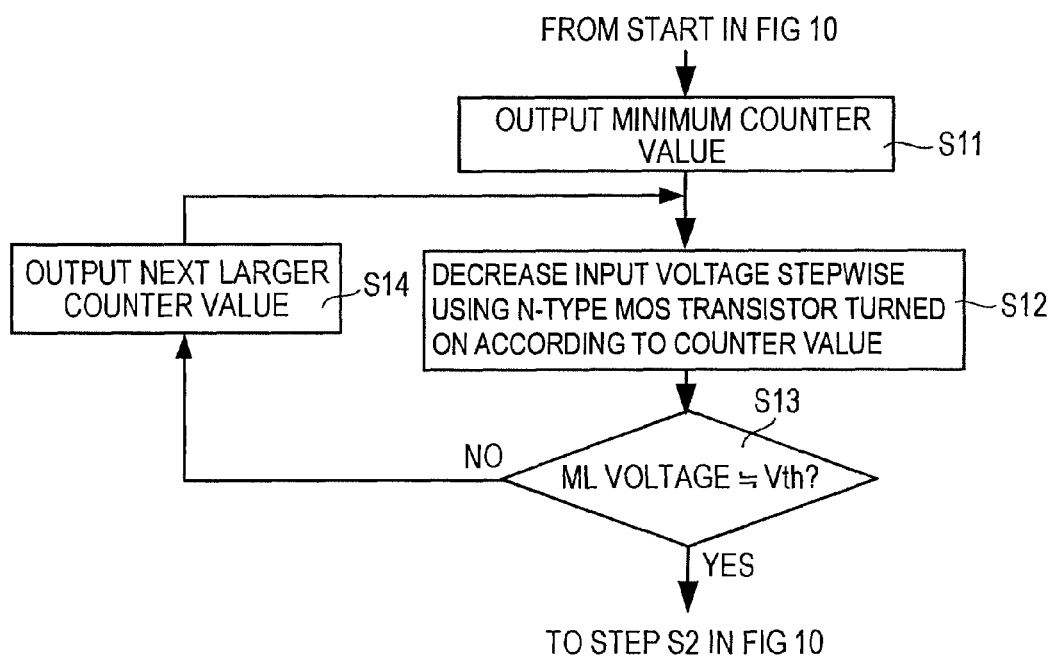
FIG. 11 is a flowchart for illustrating detailed operation of Step S1 shown in FIG. 10.

FIG. 11 is a flowchart for illustrating detailed operation of Step S1 shown in FIG. 10.

Referring to FIG. 11, when a series of operations is started, the control circuit 15 of the removal circuit 1 receives the signal WL composed of "1", and externally receives counter values to store. Then, the control circuit 15 of the removal circuit 1 outputs the minimum counter value to the n-type MOS transistors 11 to 14 (Step S11).

After that, the n-type MOS transistor 11 is turned on by the counter value and causes current to flow from the node N1 to the ground node, thereby decreasing the input voltage stepwise. That is, the control circuit 15 decreases the input voltage stepwise using the n-type MOS transistor (namely, the n-type MOS transistor 11) turned on according to the counter value (Step S12).

Then, it is determined that whether or not the ML voltage is approximately equal to the threshold Vth (Step S13). When it is determined in Step S13 that the ML voltage is not approximately equal to the threshold Vth, the control circuit 15 outputs the next larger counter value to the n-type MOS transistors 11 to 14 (Step S14).

Subsequently, the series of operation returns to Step S12 and Steps S12 to Step S14 described above are repeated until it is determined in Step S13 that the ML voltage is approximately equal to the threshold Vth.

When it is determined in Step S13 that the ML voltage is approximately equal to the threshold Vth, the series of operation goes to Step S2 shown in FIG. 10.

Incidentally, Step S13 corresponds to determining whether or not the output voltage Vout of the differential amplifier 20 has been inverted. Determination in Step S13 that the ML voltage is not approximately equal to the threshold Vth corresponds to determining that the output voltage Vout of the differential amplifier 20 has not been inverted while determination that the ML voltage is approximately equal to the threshold Vth corresponds to determining that the output voltage Vout of the differential amplifier 20 has been inverted. This is because the output voltage Vout of the differential amplifier 20 is determined when the ML voltage approximately equals the threshold Vth.

In this way, according to the present invention, offset voltage is digitally removed from the input voltage and then offset voltage is removed, in an analog manner, from the voltage subjected to the digital offset voltage removal. That is, offset voltage is removed from the input voltage Vin by means of digital offset voltage removal and analog offset voltage removal carried out serially.

This makes it possible to roughly remove offset voltage using the removal circuit 1 and then finely remove offset voltage using the removal circuit 2.

Therefore, the offset voltage removal method according to the present invention is characterized in that offset voltage is removed from the input voltage Vin with a first accuracy and that remaining offset voltage is subsequently removed, with a second accuracy higher than the first accuracy, from the voltage subjected to offset voltage removal.

This makes it possible to reduce capacitance of the capacitor 27 in the removal circuit 2 while curbing increases in the area of the removal circuit 1.

An attempt to accurately remove offset voltage only in a digital manner using the removal circuit 1 alone will require a large circuit scale, resulting in increases in circuit area.

On the other hand, an attempt to accurately remove offset voltage only in an analog manner using the removal circuit 2 alone will require large capacitance, resulting in increases in circuit area and increases in delay.

By carrying out digital offset voltage removal and analog offset voltage removal serially, it is possible to realize highly accurate offset voltage removal with the problems of the two approaches solved.

In that case, it is necessary to carry out the digital offset voltage removal first. This has been realized as the present inventor has hit upon an idea that offset voltage can be roughly removed in a digital manner if circuit scale is reduced and this is not something that can be realized by a simple combination of digital offset voltage removal and analog offset voltage removal.

Also, in the offset removal circuit 10 according to the present invention, since the capacitance of the capacitor 27 can be reduced, it is possible to reduce delays and thereby realize real-time offset voltage removal.

Next, an associative memory using the offset removal circuit 10 shown in FIG. 1 will be described.

Figure 12:
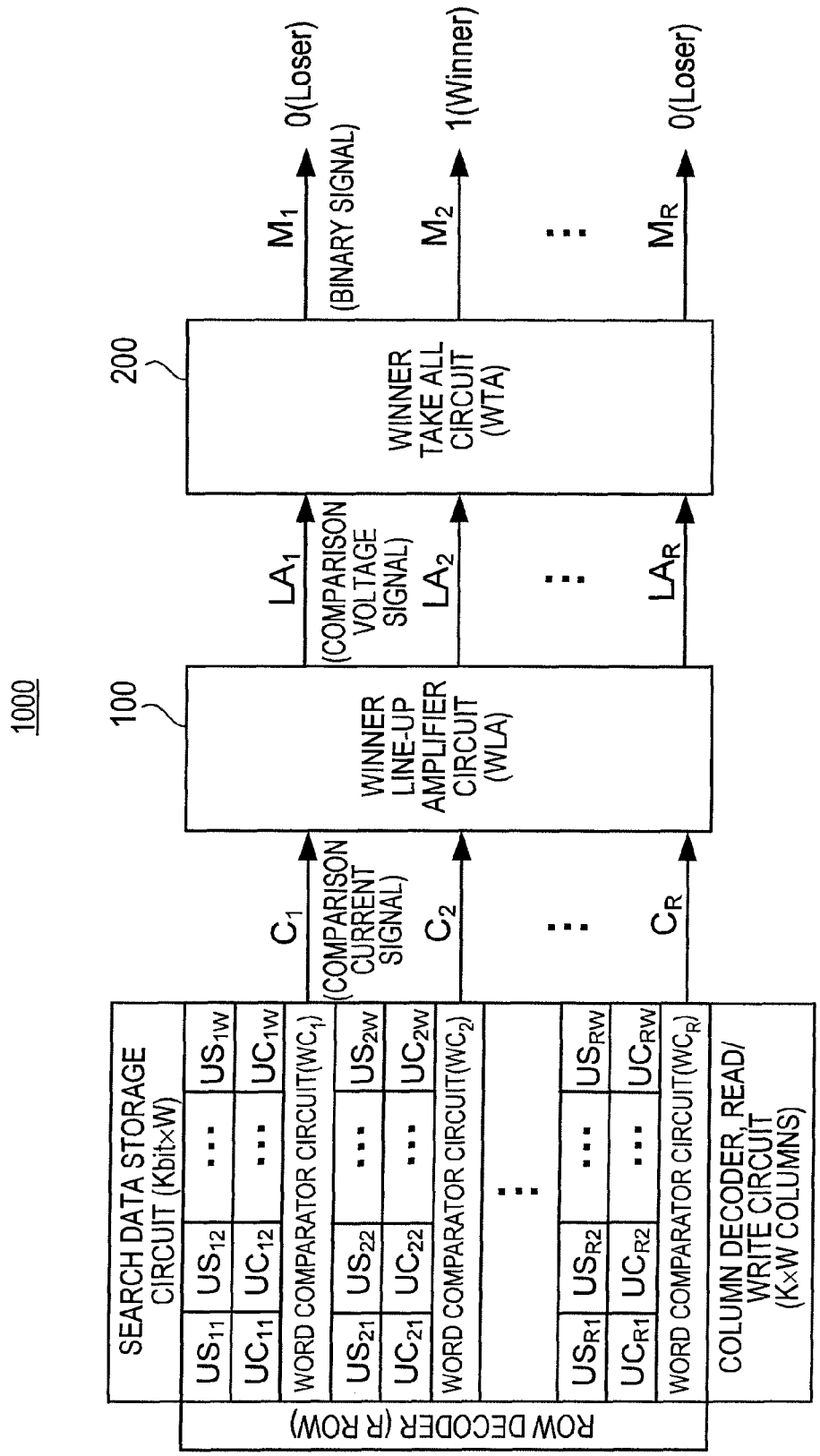
FIG. 12 is a block diagram of an associative memory using the offset removal circuit shown in FIG. 1.

FIG. 12 is a block diagram of an associative memory using the offset removal circuit 10 shown in FIG. 1. Noted that the associative memory is a fully-parallel associative memory.

Referring to FIG. 12, an associative memory 1000 according to the present invention includes a unit data storage circuit (US) which stores reference data, a unit data comparator circuit (UC) which compares the reference data and search data, a word comparator circuit (WC) which converts a comparison signal into a current value, a winner line-up amplifier circuit (WLA) 100 which converts a comparison current signal into a voltage and amplifies the resulting voltage, and a winner take all circuit (WTA) 200 which further amplifies an output from the WLA circuit 100. Besides, the associative memory 1000 also includes a search data storage circuit, row decoder, column decoder, and read/write circuit as peripheral circuits.

The unit data comparator circuit compares reference data with search data and the word comparator circuit WC outputs a comparison current signal C which represents results of comparison between the reference data and search data to the WLA circuit 100.

The WLA circuit 100 converts the comparison current signal C into a comparison voltage signal LA, removes offset voltage by the method described above, and amplifies the comparison voltage signal LA. The WTA circuit 200 removes offset voltage by the method described above and further amplifies the comparison voltage signal LA. Eventually, the WTA circuit 200 set a threshold, and thereby outputs the best matching data (winner) as 1, and the other data (loser) as 0.

The associative memory 1000 operates in fully-parallel mode and thereby enables high speed searches. Also, the use of an analog mode for the word comparator circuit WC, WLA circuit 100, and WTA circuit 200 allows the area to be reduced greatly compared to a digital-only associative memory.

A block diagram (FIG. 1) of the associative memory 1000 according to the present embodiment is similar to conventional ones, but the associative memory 1000 according to the present embodiment is characterized by internal configurations of the WLA circuit 100 and WTA circuit 200.

[WLA Circuit 100]

Figure 13:
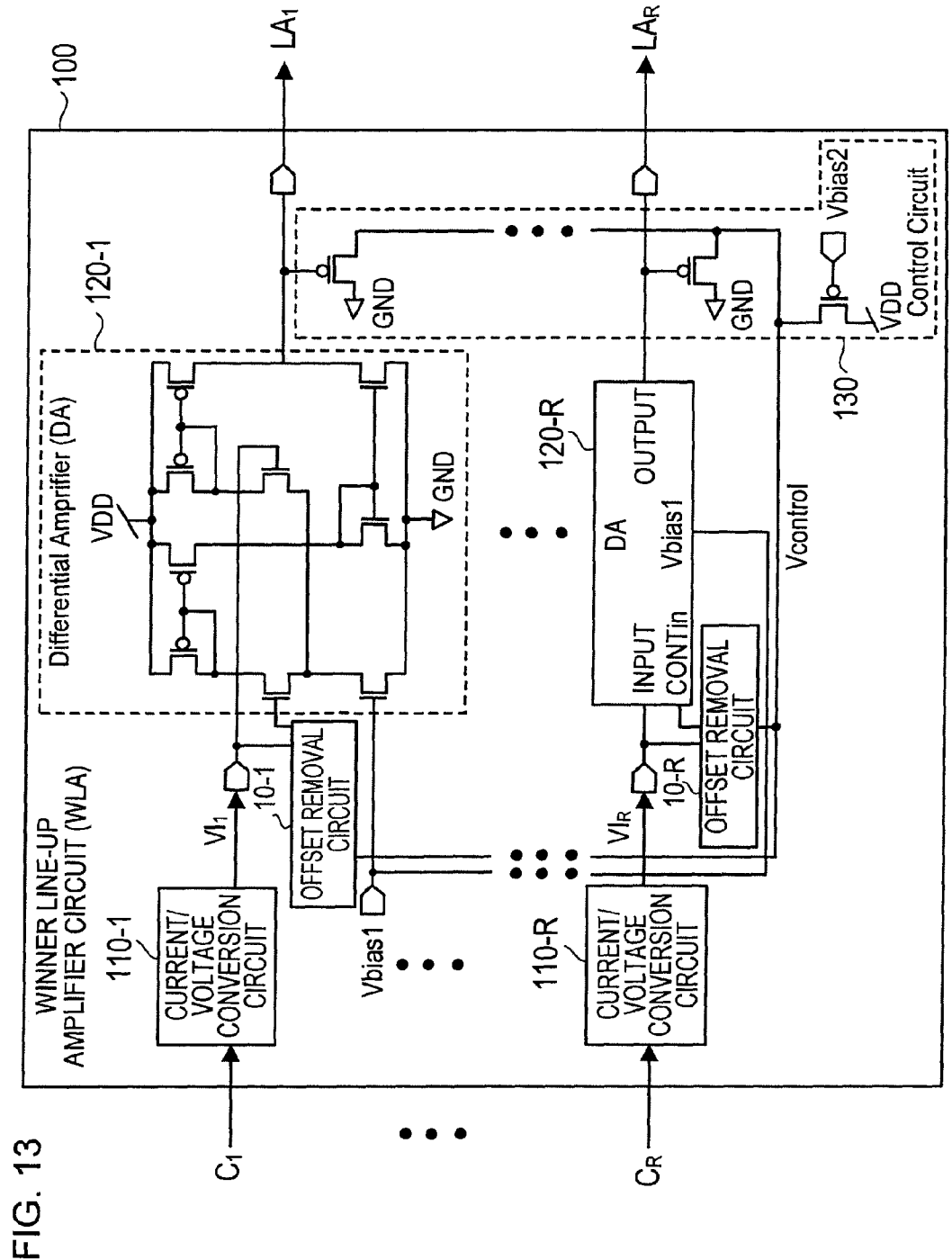
FIG. 13 is a block diagram showing an internal configuration of a WLA circuit shown in FIG. 12.

FIG. 13 is a block diagram showing an internal configuration of the WLA circuit 100 shown in FIG. 12. Referring to FIG. 13, the WLA circuit 100 includes current/voltage conversion circuits 110-1 to 110-R, offset removal circuits 10-1 to 10-R, differential amplifiers 120-1 to 120-R, and a control circuit 130.

The offset removal circuits 10-1 to 10-R are provided corresponding to the differential amplifiers 120-1 to 120-R. Each of the offset removal circuits 10-1 to 10-R is made up of the offset removal circuit 10 shown in FIG. 1.

The differential amplification circuits 120-1 to 120-R are provided corresponding to the current/voltage conversion circuits 110-1 to 110-R.

Minimum distance data (winner) and other data (losers) are inputted in the WLA circuit 100 in advance as a low-current and high-current comparison current signals $C_1$ to $C_R$, respectively, by word comparator circuits $WC_1$ to $WC_R$ and converted into comparison voltage signals $VI_1$ to $VI_R$ by the current/voltage conversion circuits 110-1 to 110-R. In this way, the comparison current signals $C_1$ to $C_R$ from the word comparator circuits $WC_1$ to $WC_R$ are at a minimum in a winner row, and so are the comparison voltage signals $VI_1$ to $VI_R$.

The comparison voltage signals $VI_1$ to $VI_R$ are inputted, respectively, to one input of the differential amplifiers 120-1 to 120-R. A CONTROL voltage from the control circuit 130 is inputted commonly to the other input of the differential amplifiers 120-1 to 120-R.

The offset removal circuits 10-1 to 10-R remove offset voltage from the comparison voltage signals $VI_1$ to $VI_R$, respectively, by the method described above and input the voltage signals $VI_1$ to $VI_R$ with the offset voltage removed to one input of the differential amplifiers 120-1 to 120-R.

The control circuit 130 generates a control voltage Vcontrol comparable to the comparison voltage signals VI of the winner row (minimum distance data).

When distance between the input data and winner becomes larger and distance between the winner and losers becomes smaller, the comparison voltage signals $VI_1$ to $VI_R$ generate voltage differences of only a few mV. Conventional circuits (Japanese Patent Laid-Open No. 2002-288985), which provide low amplification degrees, require several stages of WTA circuits (amplifiers), to amplify voltage differences of a few mV and divide the voltage signals by a threshold, resulting in increases in search time, power consumption, and area.

Thus, the present embodiment uses the wide-range differential amplifiers 120-1 to 120-R as shown in FIG. 13. This overcomes drawbacks of conventional fully-parallel associative memories.

[Operation of Differential Amplifiers 120-1 to 120-R]

Figure 14:
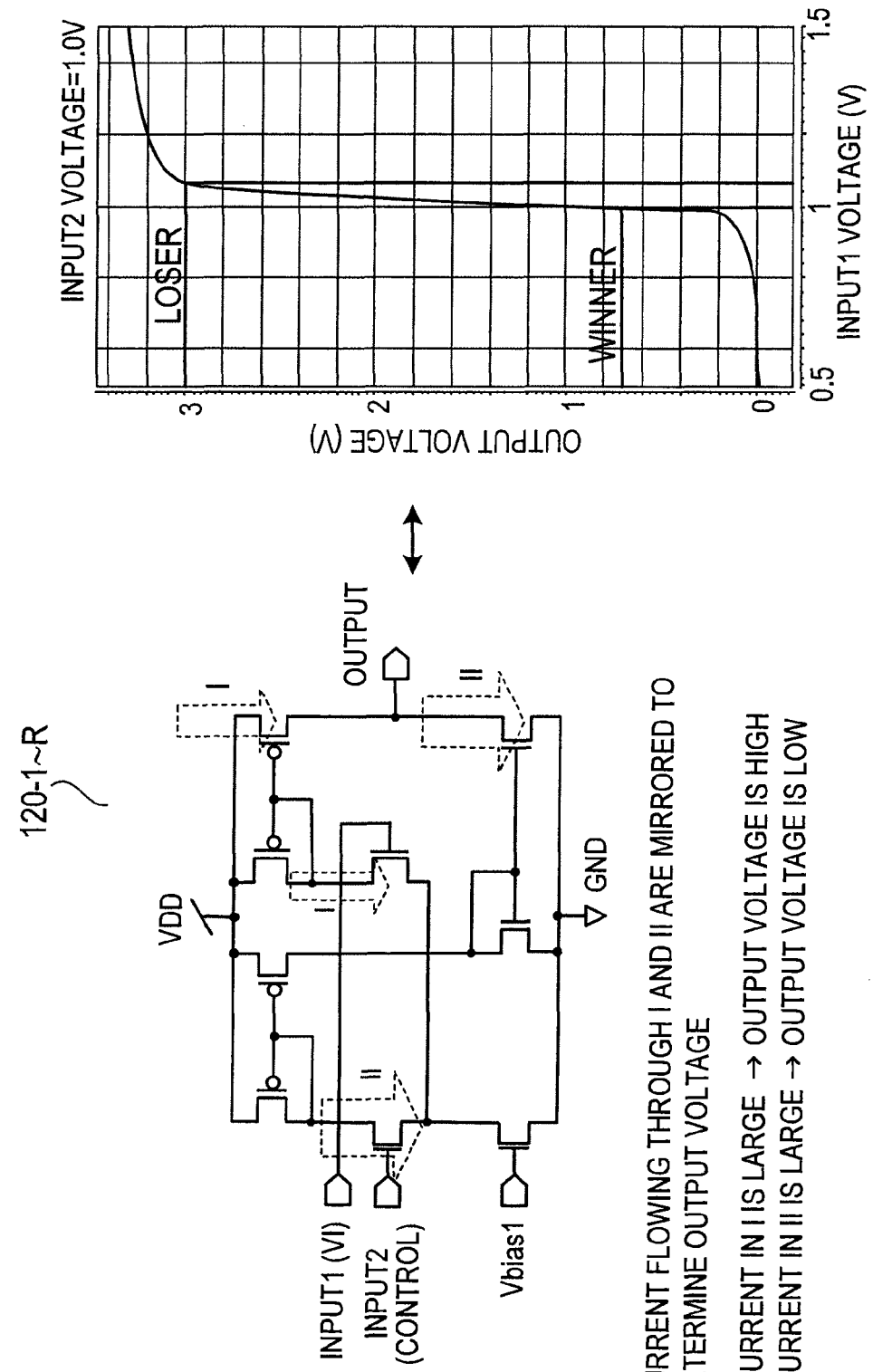
FIG. 14 is a diagram for illustrating operation of differential amplifiers shown in FIG. 13.

FIG. 14 is a diagram for illustrating operation of differential amplifiers 120-1 to 120-R shown in FIG. 13.

Referring to FIG. 14, the wide-range differential amplifiers 120-1 to 120-R output an output voltage composed of GND (winner) when an INPUT1 voltage (VI) is smaller than an INPUT2 voltage (Vcontrol) and output an output voltage composed of VDD when INPUT1 (VI) is larger than INPUT2 (Vcontrol) (losers).

Thus, the OUTPUT voltage is equal to GND in the case of the winner, and equal to VDD in the case of losers. As can be seen from the graph in FIG. 14, the inputted voltage differences are outputted depending on the amplification degrees of the differential amplifiers 120-1 to 120-R. Concrete operation is as follows.

First, in non-operating state, the INPUT1 and Vcontrol voltages are raised to VDD by precharging. Next, in operating state, the winner and loser voltages are inputted to INPUT1.

Consequently, the INPUT1 voltage is decreased by the input of the winner and loser voltages and the OUTPUT voltage decreases, following the INPUT1 voltage. As the OUTPUT voltage decreases, a current flowing through a voltage follower of the control circuit 130 increases, causing the voltage Vcontrol to decrease gradually.

As the voltage Vcontrol falls, the OUTPUT voltage falls to some extent, and when eventually a current flowing from VDD and a current flowing to GND become equal in the control circuit 130, the Vcontrol voltage is stabilized. The voltage coming into INPUT1 is controlled by the word comparator circuits WC in advance such that the voltage in the winner row will be lowest, and the OUTPUT voltage falls first. Therefore, the Vcontrol voltage follows the winner voltage.

[Features]

A big differences between the WLA circuit 100 according to the present embodiment (FIG. 3) and conventional WLA circuits is that whereas the conventional WLA circuits directly control levels of the comparison voltage signals $VI_1$ to $VI_R$ inputted to amplifiers so as to fit them in operating ranges of the amplifiers, the WLA circuit 100 according to the present embodiment controls the operating ranges by fixing the levels of the comparison voltage signals $VI_1$ to $VI_R$ inputted to the amplifiers 120-1 to 120-R and giving a CONTROL voltage to the other input of the amplifiers 120-1 to 120-R. Large differences in amplification degree are also an advantage of the circuit according to the present embodiment. Advantages of the WLA circuit 100 according to the present embodiment will be listed below.

[1] High Amplification Degree

Whereas the conventional WLA circuits require four to six stages to amplify differences of a few mV into a few volts, according to the present embodiment, which uses the differential amplifiers 120-1 to 120-R, two stages are sufficient. This also enables high-speed searches, reduced power consumption, high reliability, and reduced area.

[2] High Area Efficiency

Since the present embodiment requires only ½ to ⅓ the number of stages compared to conventional circuits as also described in [1], the area can be reduced accordingly (although the WTA includes three times as many transistors as a conventional circuit at each stage, since the transistors are smaller than conventional ones, it is considered that required areas are almost equal).

[3] Capability to Carry Out Minimum Distance Searches at High Speed

Whereas conventional circuits have a problem in that "circuits used to amplify voltage differences between minimum distance data and the other data operate slowly, and thus taking much time to search for the minimum distance data," since the use of the wide-range differential amplifiers 120-1 to 120-R makes it possible to amplify a few mV into a few volts, minimum distance searches can be carried out at high speed.

Also, whereas the conventional WLA circuits have the drawback of operating slowly at high voltages, the circuit according to the present embodiment enables high-speed operation. Besides, since there is no need to perform level control of the comparison voltage signals $VI_1$ to $VI_R$ inputted in the differential amplifiers 120-1 to 120-R, the present embodiment can minimize the number of transistors involved with input voltages, reducing load capacitance and increasing operating speed.

[4] Capability for Self-Correction

The WLA circuit 100 according to the present embodiment includes a feedback unit for control (the control circuit 130). Whereas the conventional circuits, which use continuous feedback control, are susceptible to signal delay, the circuit according to the present embodiment, which uses occasional feedback control and makes corrections during operation to automatically carry out minimum distance searches in a proper manner, can carry out accurate minimum distance searches when operation is eventually stabilized regardless of differences in distance from input data.

[5] High Tolerance to Noise

After chips are produced, input signals are often affected by noise during actual operation, resulting in malfunctions or search errors in some cases. On the other hand, the use of differential amplifiers which involve differential control between two inputs, can reduce sensitivity to in-phase noise.

[6] Low Power Consumption

The WLA circuit 100 according to the present embodiment can keep power consumption low because a large current is passed only through the control circuit for a minimum distance data row during operation.

[7] High Reliability

When a large number of analog circuits are used, variations in characteristics of manufactured transistors can often make operation unstable. Conventional techniques require four to six stages of WLA circuits and WTA circuits to carry out minimum distance searches accurately over sufficiently large distances. However, according to the present embodiment, two stages are sufficient. This reduces the number of analog circuits accordingly, improves reliability of the entire circuit.

Also, the WLA circuit 100 according to the present embodiment controls an object used for comparison (controls the CONTROL voltage) instead of controlling the comparison voltage signals $VI_1$ to $VI_R$ inputted to the differential amplifiers 120-1 to 120-R, and thus can make corrections quickly even if the circuit is directed toward making a search error.

In discussions of reliability, digital circuits are used for comparison. Digital circuits can produce accurate outputs unless circuit breakdown or signal timing errors occur over the whole distance. However, when there is more than a certain distance, applications which use minimum distance searches do not need to perform a minimum distance search process in some cases because there is a large difference in distance from input data (e.g., assuming that a maximum distance is 512, if there is a distance of 128, which differs in ¼ of data, some applications may determine that no minimum distance data can be found).

The circuit according to the present embodiment can allocate input voltage differences preferentially in ascending order of distance (|distance 1−distance 2|=50 mV; |distance 50−distance 51|=20 mV) and can carry out minimum distance searches up to a distance of somewhere around 100 practically without problems by using circuits with higher amplification degrees.

Thus, the circuit according to the present embodiment is superior in that it can carry out minimum distance searches accurately up to a practically sufficient distance in a shorter search time with lower power consumption than digital circuits.

Next, description will be given of a simulation-based evaluation of the offset voltage removal method according to the present invention as applied to an associative memory.

Items evaluated were search time and average power consumption when 32 parallel searches were carried out at a 5-bit Manhattan distance. Also, to add an offset voltage in a simulated manner, a supply voltage was added to the positive input of differential amplifiers. In this case, a 30-mV input offset voltage was added to the WLA circuit and WTA circuit in the winner row and a 0-mV input offset voltage was added to both the WLA circuit and WTA circuit in the nearest loser row.

Figure 15:
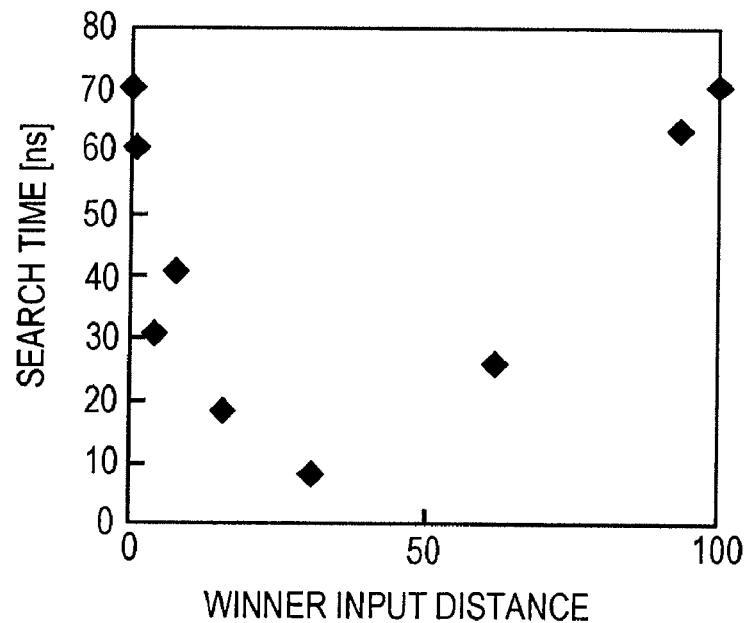
FIG. 15 is a diagram showing a relationship between search time and winner input distance.

FIG. 15 is a diagram showing a relationship between search time and winner input distance. In FIG. 15, the ordinate represents the search time and the abscissa represents the winner input distance.

Referring to FIG. 15, the search time was 71 ns or less over winner input distances of 0 to 100. Minimum search time was less than 10 ns.

Figure 16:
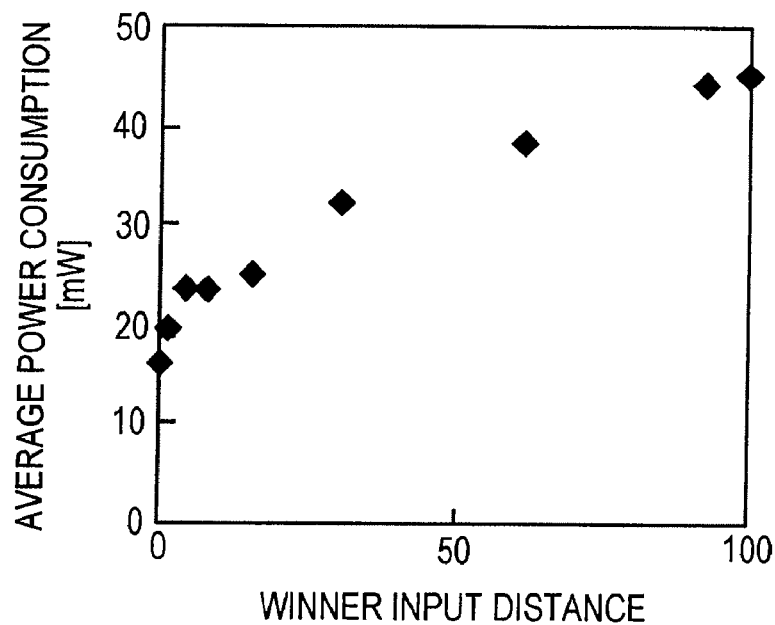
FIG. 16 is a diagram showing a relationship between average power consumption and winner input distance.

FIG. 16 is a diagram showing a relationship between average power consumption and winner input distance. In FIG. 16, the ordinate represents the average power consumption and the abscissa represents the winner input distance.

Referring to FIG. 16, the average power consumption was 45 mW or less over the winner input distances of 0 to 100.

Figure 17:
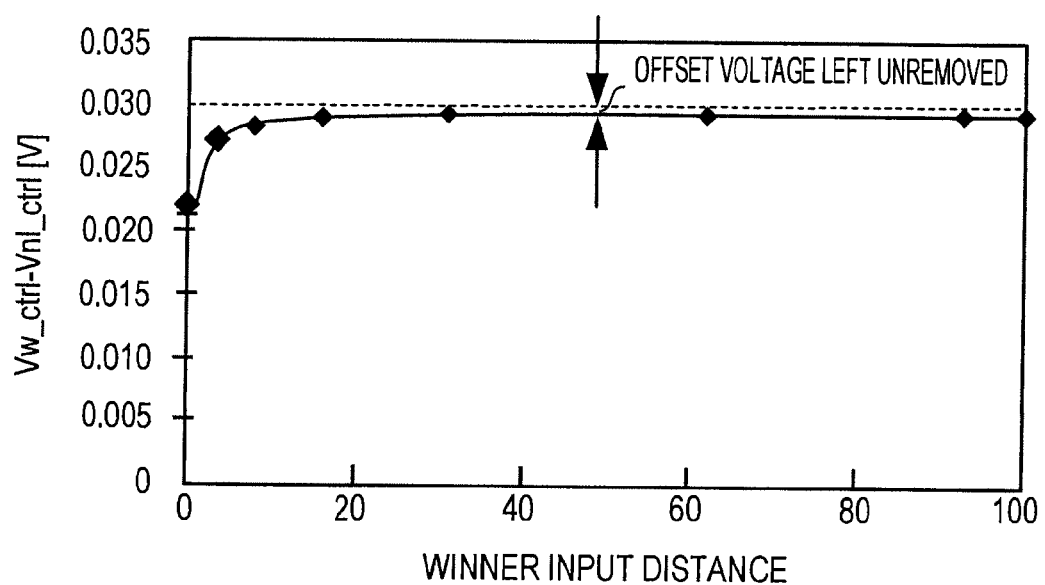
FIG. 17 is a diagram showing offset voltage removable by capacitance on the negative side of a differential amplifier.

FIG. 17 is a diagram showing offset voltage removable by capacitance on the negative side of a differential amplifier. In FIG. 17, the ordinate represents the offset voltage removable by the capacitance on the negative side of the differential amplifier and the abscissa represents the winner input distance.

Referring to FIG. 17, it was found that the capacitance on the negative side of the differential amplifier can remove up to 0.7 mW of offset voltage.

Thus, it was found that offset voltage can be reduced to less than the voltage difference on the match line even when the winner input distance is 100.

As a result, it was found that the offset removal circuits 10 make it possible to carry out searches accurately up to a winner input distance of 100.

Incidentally, although it has been stated that the removal circuit 1 includes four n-type MOS transistors 11 to 14, the present invention is not limited by this and all that is required is that the removal circuit 1 have a plurality of n-type MOS or p-type MOS transistors which differ in resistance from each other.

Also, the removal circuit 2 may include p-type MOS transistors instead of n-type MOS transistors.

In the present example, the removal circuit 1 constitutes a "first removal circuit" and the removal circuit 2 constitutes a "second removal circuit."

It should be understood that the embodiment disclosed herein is exemplary in all respects, and not restrictive. The scope of the present invention is defined only by the appended claims rather than the embodiment and description thereof. Accordingly, the present invention is to be considered as including all possible modifications and variations coming within the scope of the invention as defined by the appended claims and any equivalent meaning and scope.

Industrial Applicability

The present invention is applicable to an offset removal circuit which can remove offset voltage with high accuracy. Also, the present invention is applicable to an associative memory equipped with the offset removal circuit which can remove offset voltage with high accuracy. Furthermore, the present invention is applicable to an offset voltage removal method which can remove offset voltage with high accuracy.

The invention claimed is:

1. An offset removal circuit comprising:
a first removal circuit connected to a non-inverting input terminal of a differential amplifier, wherein the first removal circuit comprises a plurality of transistors coupled in parallel between the non-inverting input terminal and a ground node, and wherein the first removal circuit is configured to create a corrected voltage by removing, with a first accuracy, at least a first portion of an offset voltage from an input voltage inputted to the differential amplifier; and
a second removal circuit connected to an inverting input terminal of the differential amplifier, wherein the second removal circuit is configured to remove at least a second portion of the offset voltage, with a second accuracy greater than the first accuracy, from the corrected voltage.

2. The offset removal circuit of claim 1, wherein:
the first removal circuit is configured to digitally remove the at least a first portion of the offset voltage from the input voltage; and
the second removal circuit is configured to remove the at least a second portion of the offset voltage in an analog manner from the corrected voltage.

3. The offset removal circuit of claim 1, wherein:
the first removal circuit is configured to digitally remove the at least a first portion of the offset voltage from the input voltage when the second removal circuit is stopped; and
the second removal circuit is configured to remove the at least a second portion of the offset voltage from the corrected voltage, in an analog manner when the first removal circuit is stopped.

4. The offset removal circuit of claim 1, wherein the plurality of transistors comprises a plurality of metal oxide semiconductor (MOS) transistors, and wherein at least two of the plurality of transistors have different respective resistances.

5. The offset removal circuit of claim 1, wherein the second removal circuit comprises a capacitor connected between the inverting input terminal and a control node, and wherein the control node is configured to receive a control voltage and a voltage obtained by subtracting the control voltage from an output voltage of the differential amplifier.

6. The offset removal circuit of claim 5, wherein the second removal circuit further comprises:
a first transistor connected to the capacitor;
a second transistor connected to the capacitor; and
a third transistor connected to the capacitor, the second transistor, and the inverting input terminal.

7. The offset removal circuit of claim 6, wherein the control circuit is further configured to output the digital signal to the plurality of transistors such that a digital value increases from a minimum value.

8. The offset voltage removal circuit of claim 5, wherein the second removal circuit further comprises:
   a first transistor connected to the capacitor;
   a second transistor connected to the capacitor; and
   a third transistor connected to the capacitor, the second transistor, and the inverting input terminal.

9. The offset removal circuit of claim 1, wherein the first removal circuit includes a control circuit configured to decrease the input voltage stepwise until an output voltage of the differential amplifier is inverted, by turning on and off the plurality of transistors using a digital signal.

10. The offset removal circuit of claim 9, wherein the digital signal comprises the output signal of the differential amplifier received at the first removal circuit via two or more inverters connected in series.

11. The offset removal circuit of claim 1, wherein sources of the plurality of transistors are connected to the ground node, and wherein drains of the plurality of transistors are connected the non-inverting input terminal of the differential amplifier.

12. The offset removal circuit of claim 1, wherein the removal circuit is further configured to receive a counter value in digital form and address the plurality of transistors according to the counter value.

13. The offset removal circuit of claim 12, wherein the counter value is in a four-bit digital form.

14. The offset voltage removal circuit of claim 1, further comprising turning the plurality of transistors on and off using a digital signal to decrease the input voltage until an output voltage of the differential amplifier is inverted.

15. The offset voltage removal circuit of claim 14, wherein the digital signal comprises the output signal of the differential amplifier, the method further comprising receiving the digital signal at the first removal circuit via two or more inverters connected in series.

16. The offset voltage removal circuit of claim 1, wherein sources of the plurality of transistors are connected to the ground node, and wherein drains of the plurality of transistors are connected the non-inverting input terminal of the differential amplifier.

17. The offset voltage removal circuit of claim 1, further comprising:
   receiving a counter value in digital form at the first removal circuit; and
   addressing the plurality of transistors according to the counter value.

18. The offset voltage removal circuit of claim 17, wherein the counter value is in a four-bit digital form.

19. An associative memory comprising:
   a memory array unit configured to compare in parallel each of a plurality of pre-stored reference data with inputted search data and generate a plurality of comparison current signals having respective current values corresponding to respective comparison results;
   a WLA (Winner Line-up Amplifier) circuit configured to convert the plurality of comparison current signals into voltages and amplify the voltages; and
   a WTA (Winner Take All) circuit configured to further amplify an output from the WLA circuit, wherein the WLA circuit includes:
      a plurality of current/voltage conversion circuits provided corresponding to the plurality of comparison current signals, and configured to each convert the corresponding comparison current signal into a comparison voltage signal;
      a plurality of differential amplification circuits provided corresponding to the plurality of current/voltage conversion circuits, and configured to each receive the comparison voltage signal from the corresponding current/voltage conversion circuits at an input; and
      a control circuit configured to generate a control voltage from outputs of the plurality of differential amplification circuits and provide the generated control voltage commonly to another input of the plurality of differential amplification circuits, the control voltage following a minimum or maximum voltage of the plurality of comparison voltage signals,
   wherein each of the plurality of differential amplifier circuits comprises:
      a differential amplifier configured to amplify the comparison voltage signal from the corresponding current/voltage conversion circuit and output the amplified comparison voltage signal,
      a first removal circuit connected to a non-inverting input terminal of the differential amplifier, wherein the first removal circuit comprises a plurality of transistors coupled in parallel between the non-inverting input terminal and a ground node, and wherein the first removal circuit is configured to create a corrected voltage by removing, with a first accuracy at least a first portion of an offset voltage from the comparison voltage signal, and
      a second removal circuit connected to an inverting input terminal of the differential amplifier, wherein the second removal circuit is configured to remove at least a second portion of the offset voltage, with a second accuracy greater than the first accuracy, from the corrected voltage.

20. An offset voltage removal method, comprising:
   creating a corrected voltage by removing, via a first removal circuit, at least a first portion of an offset voltage from an input voltage with a first accuracy, wherein the first removal circuit comprises a plurality of transistors coupled in parallel between a non-inverting input terminal of a differential amplifier and a ground rode; and
   removing, via, a second removal circuit, at least a second portion of the offset voltage from the corrected voltage with a second accuracy greater than the first accuracy.

21. The offset voltage removal method of claim 20, wherein:
   the removing the at least a first portion of the offset voltage comprises digitally removing the at least a first portion of the offset voltage; and
   the removing the at least a second portion of the offset voltage comprises removing the at least a second portion of the offset voltage in an analog manner.

22. The offset voltage removal method of claim 21, wherein:
   the removing the at least a first portion of the offset voltage is carried out when the removing the at least a second portion of the offset voltage is stopped; and
   the removing the at least a second portion of the offset voltage is carried out when the removing the at least a first portion of the offset voltage is stopped.

23. The offset voltage removal method of claim 21, wherein:
   the removing the at least a first portion of the offset voltage includes:
      flowing a current on an input line to the ground node by a transistor of the plurality of transistors turned on according to a digital value and thereby decreasing a voltage on the input line stepwise, wherein the input line is connected to the non-inverting input terminal of the differential amplifier;

determining whether or not an output voltage of the differential amplifier has been inverted;

flowing a current on the input line to the ground node by a transistor of the plurality of transistors turned on according to an increased digital value and thereby decreasing a voltage on the input line stepwise when it is determined that the output voltage of the differential amplifier has not been inverted; and executing repeatedly the flowing a current on the input line to the ground node by a transistor of the plurality of transistors until the output voltage of the differential amplifier is inverted.

24. The offset voltage removal method of claim 20, wherein the second removal circuit comprises a capacitor connected between an inverting input terminal of the differential amplifier and a control node, the method further comprising receiving a control voltage at the control node a voltage obtained by subtracting the control voltage from an output voltage of the differential amplifier.

* * * * *

UNITED STATES PATENT AND TRADEMARK OFFICE
CERTIFICATE OF CORRECTION

PATENT NO. : 8,331,120 B2  Page 1 of 1
APPLICATION NO. : 12/665316
DATED : December 11, 2012
INVENTOR(S) : Mattausch et al.

It is certified that error appears in the above-identified patent and that said Letters Patent is hereby corrected as shown below:

In the Drawings

In Fig. 11, Sheet 6 of 11, delete "FIG 10" and insert -- FIG. 10 --, therefor at each occurrence throughout the Figure.

In Fig. 13, Sheet 8 of 11, delete "Amprifier" and insert -- Amplifier --, therefor.

In the Specifications

In Column 4, Line 48, delete "is" and insert -- is a --, therefor.

In Column 7, Line 29, delete "Vcontrok," and insert -- Vcontrol, --, therefor.

In Column 15, Line 24, delete "O-mV" and insert -- 0-mV --, therefor.

In the Claims

In Column 16, Line 46, in Claim 3, delete "voltage," and insert -- voltage --, therefor.

In Column 17, Line 19, in Claim 11, delete "connected the" and insert -- connected to the --, therefor.

In Column 17, Line 39, in Claim 16, delete "connected the" and insert -- connected to the --, therefor.

In Column 18, Line 23, in Claim 19, delete "accuracy" and insert -- accuracy, --, therefor.

In Column 18, Line 38, in Claim 20, delete "rode;" and insert -- node; --, therefor.

In Column 18, Line 39, in Claim 20, delete "via," and insert -- via --, therefor.

Signed and Sealed this
Sixteenth Day of April, 2013

Teresa Stanek Rea
*Acting Director of the United States Patent and Trademark Office*